(12) United States Patent
Divakaruni et al.

(10) Patent No.: US 6,727,540 B2
(45) Date of Patent: Apr. 27, 2004

(54) STRUCTURE AND METHOD OF FABRICATING EMBEDDED DRAM HAVING A VERTICAL DEVICE ARRAY AND A BORDERED BITLINE CONTACT

(75) Inventors: Ramachandra Divakaruni, Ossining, NY (US); Babar Ali Khan, Ossining, NY (US); Carl John Radens, LaGrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/227,404

(22) Filed: Aug. 23, 2002

(65) Prior Publication Data

US 2004/0036100 A1 Feb. 26, 2004

(51) Int. Cl.[7] .................... H01L 27/108; H01L 29/76; H01L 29/94
(52) U.S. Cl. .................... 257/301; 257/296; 257/301
(58) Field of Search .................... 257/301, 302, 257/296; 438/243, 242, 244, 268, 272

(56) References Cited

U.S. PATENT DOCUMENTS

| | | | |
|---|---|---|---|
| 4,816,884 A | | 3/1989 | Hwang et al. |
| 5,455,192 A | * | 10/1995 | Jeon ............... 438/244 |
| 5,692,281 A | | 12/1997 | Rajeevakumar |
| 5,831,301 A | | 11/1998 | Horak et al. |
| 5,895,946 A | | 4/1999 | Hamamoto et al. |
| 6,091,094 A | | 7/2000 | Rupp |
| 6,137,128 A | | 10/2000 | Holmes et al. |
| 6,184,549 B1 | | 2/2001 | Furukawa et al. |
| 6,188,095 B1 | | 2/2001 | Hieke |
| 6,200,851 B1 | | 3/2001 | Arnold |
| 6,211,544 B1 | | 4/2001 | Park et al. |
| 6,281,539 B1 | | 8/2001 | Mandelman et al. |
| 6,391,705 B1 | * | 5/2002 | Hsiao et al. ........... 438/243 |

OTHER PUBLICATIONS

G. Bronner et al, "A Fully Planarized 0.25um CMOS Technology for 256Mbit DRAM and Beyond", 1995 Symposium on VLSI Technology Digest of Technical Papers, pp. 15–16.

U. Gruening, et al., "A Novel Trench DRAM Cell with a Vertical Access Transistor and Buried Strap . . . ", IEDM 99–25, 1999 IEEE.

C. Radens, et al., "A 0.135 um2 6F2 Trench–Sidewall Vertical Device Cell for 4Gb/16Gb DRAM", 2000 Symposium on VLSI Technology Digest to Technical Papers, pp. 80–81.

T. Rupp, et al., "Extending Trench DRAM Technology to 0.15um Groundrule and Beyond", 1999 IEEE, IEDM 99–33, pp. 2.3.1–2.3.4.

* cited by examiner

*Primary Examiner*—Phat X. Cao
*Assistant Examiner*—Theresa Doan (57) ABSTRACT

An integrated circuit including a dynamic random access memory (DRAM) array is disclosed herein in which a DRAM cell includes a storage capacitor within a deep trench, a transistor having a channel extending along a sidewall of the deep trench and a gate conductor within the deep trench, and a wordline contacting the gate conductor from above, wherein the wordline has a centerline which is offset from the centerline of the gate conductor. The DRAM cell further includes active area extending from the transistor channel, and a bitline contact to the active area which is bordered by an insulating spacer of the sidewall of the wordline.

16 Claims, 8 Drawing Sheets

STRUCTURE AND METHOD OF FABRICATING EMBEDDED DRAM HAVING A VERTICAL DEVICE ARRAY AND A BORDERED BITLINE CONTACT

FIELD OF THE INVENTION

The present invention relates to semiconductor processing, and more specifically to the fabrication of combined integrated circuits having both a dynamic random access memory (DRAM) and other circuits, wherein the DRAM includes an array of vertical transistor devices.

BACKGROUND OF THE INVENTION

Significant challenges exist in the fabrication of combined integrated circuits having both an embedded DRAM and other circuit components, e.g. CMOS logic circuits. Processes which are required for high performance CMOS logic are difficult to mate with DRAM processing requirements. For example, high performance CMOS logic requires gate conductors to have narrow line widths to support higher switching speeds. Narrow line width gate conductors, smaller than lithographically printable line widths, can be made by first printing and etching photoresist patterns, and then etching the sidewalls of the patterns in what is known as "mask trim" prior to etching an underlying gate conductor layer. High performance CMOS logic also favors gate conductors having mostly silicide or metal content and little to no polysilicon content.

On the other hand, conventional DRAMs having planar device arrays require gate conductors to have certain characteristics which reduce off current (the current when the memory array transistor is biased below threshold voltage), in order to support the required data retention time between successive refresh cycles. First, somewhat wider line width gate conductors are required than for logic, with width at about the minimum groundrule. Second, gate conductors must be of polysilicon, rather than silicide or metal, where they contact the gate oxide. Third, gate conductor lines in planar DRAMs require sidewall oxidations.

Also, unlike CMOS logic circuits, gate conductor lines are spaced very closely, leaving about 1F space or less (the minimum groundrule) between adjacent gate conductors in planar DRAMs. Consequently, in planar DRAMs, only borderless bitline contacts can be used. Borderless bitline contacts have conductive studs which at least partially overlie the tops of adjacent gate conductors. Because of this, thick dielectric caps must be formed on top of the gate conductors, as insulators for the borderless bitline contacts which overlie them. Such thick dielectric caps increase process complexity and undesirably increase the height and aspect ratio of gaps between adjacent gate conductors which are to be filled by deposited dielectric.

It would be desirable to simplify the processing of combined integrated circuits having both a logic portion and an embedded DRAM portion, such that gate conductor lines in the logic portion can be processed together with wordlines in the DRAM array portion.

Accordingly, it would be desirable to use narrow line width wordlines in the DRAM array which are fabricated together with the narrow line width gate conductors of the logic circuitry. It would also be desirable to use a bordered, rather than borderless, bitline contact in the DRAM array, such that the dielectric capping layer over the wordline could be eliminated.

SUMMARY OF THE INVENTION

According to a first aspect of the invention, an integrated circuit including a dynamic random access memory (DRAM) array is provided in which a DRAM cell includes a storage capacitor within a deep trench, a transistor having a channel extending along a sidewall of the deep trench and a gate conductor within the deep trench, and a wordline contacting the gate conductor from above, wherein the wordline has a centerline which is offset from the centerline of the gate conductor. The DRAM cell further includes active area extending from the transistor channel, and a bitline contact to the active area which is bordered by an insulating spacer on the sidewall of the wordline.

According to another aspect of the invention, a method is provided for fabricating a dynamic random access memory array, which includes etching deep trenches in a substrate; forming storage capacitors and transistors within the deep trenches, and forming active areas extending from the deep trenches. Such method further includes forming top oxide layers above the active areas and forming wordlines contacting gate conductors of the vertical transistors from above, the wordlines contacting the top oxide layers from above, and the wordlines further having centerlines horizontally offset from centerlines of the gate conductors. Bitline contacts to the active areas are formed through apertures etched in the top oxide layers.

DETAILED DESCRIPTION OF THE PREFERRED EMBODIMENTS

Accordingly, in the following embodiments, an embedded DRAM is described in which wordlines of the DRAM array are fabricated together with gate conductors of the logic portion, according to logic fabrication requirements. This is possible because the wordlines in the DRAM array are not constrained to the planar DRAM processing requirements described in the background, as the wordlines are not the gate conductors of the DRAM array, but rather, signal conductors in contact with the gate conductors, which lie within the deep trenches. In addition, wordlines of the DRAM array need not have a minimum polysilicon content, nor require sidewall oxidations. Finally, an embodiment is described in which a bordered bitline contact is used, similar to the contact used in a logic process, eliminating the need for thick dielectric caps on wordlines of the DRAM array.

Figure 1A:
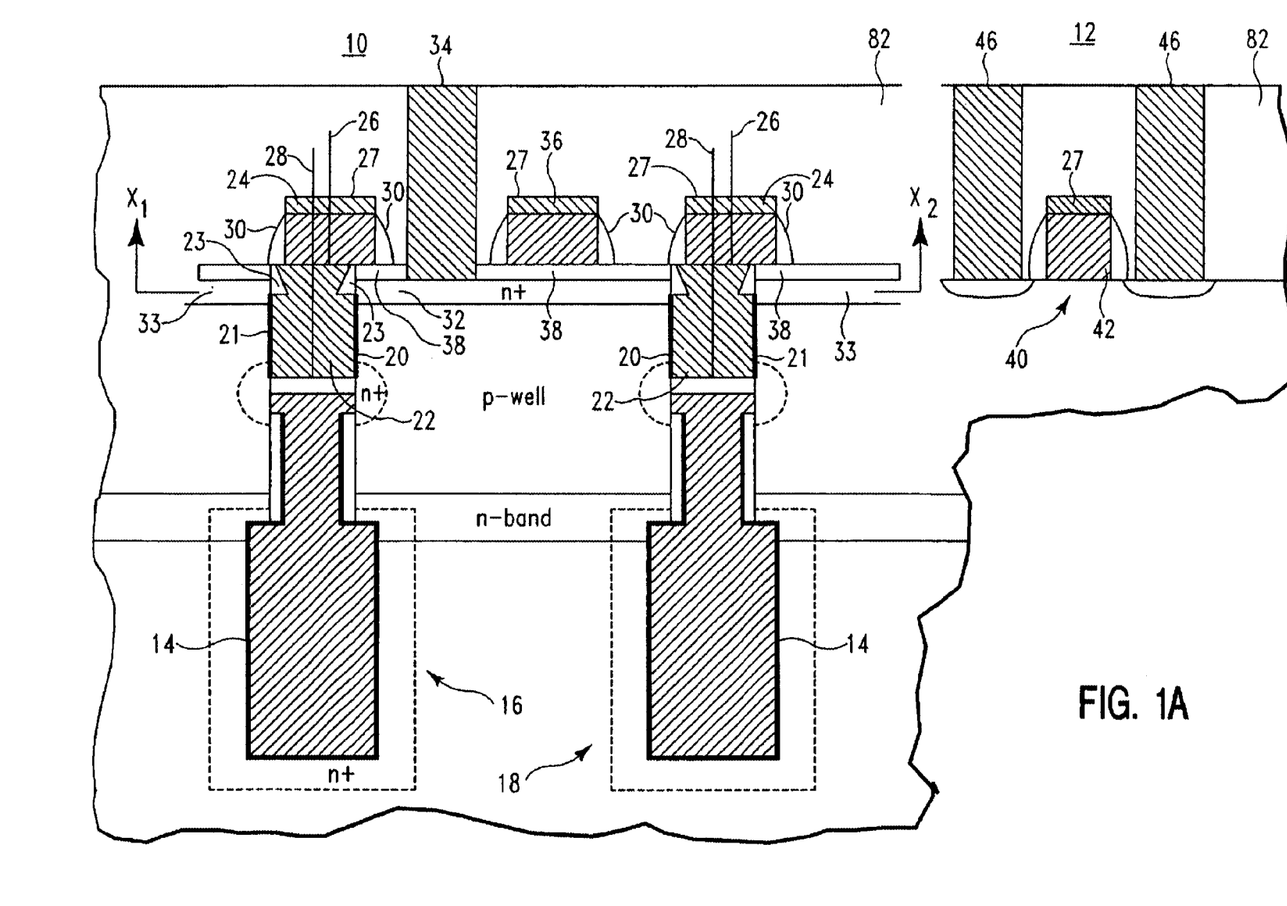
FIG. 1A is a cross-sectional view of a structural embodiment of the invention.

FIG. 1A illustrates a cross-sectional view of a first embodiment of the invention. An array portion 10 and a supports portion 12 are shown in FIG. 1A. In the array portion 10, a storage capacitor 14 is shown formed within a first deep trench 16. Another storage capacitor 14 is shown formed within a second deep trench 18. Each storage capacitor 14 is accessed by a first transistor having a channel 20 of length extending along a sidewall of the deep trench 16 or 18, and each transistor has a gate conductor 22 overlying the storage capacitor 14. Preferably, insulating spacers 23 are present at the top within deep trenches 16 and 18. An upper source/drain active area 32 extends away from the channel 20 of the transistor. In addition to first transistors having channels 20, storage capacitors 14 are preferably accessed by second transistors having channels 21 of length oriented along other sidewalls of deep trenches 16, 18. Second source/drain active areas 33 extend from upper locations of second transistors in a different direction from that of first active area 32. An array top oxide 38 insulates the tops of active areas 32 and 33.

In the array portion 10, a wordline 24 conductively contacts the gate conductor 22 from above, and has a centerline 26 which is offset from a centerline 28 of the gate conductor 20. Wordlines 24 have at least a top layer 27 comprising a metal or metal silicide. However, wordlines 24 may be formed entirely of a metal silicide, if desired such that the metal silicide extends down and is in contact with gate conductor 22 or to array top oxide 38. A passing conductor is denoted by 36. The passing conductor 36 may be another wordline of the DRAM array which crosses the active area 32, or it may be another conductor which does not function as a wordline. The passing conductor has a least a top layer 27 comprising a metal or metal silicide. However, passing conductor 36 may be formed entirely of a metal silicide, if desired, such that the metal silicide extends down and is in contact with array top oxide 38.

Each wordline further includes insulating sidewall spacers 30, and a bitline contact 34 is made to the active area 32 from above through an opening etched in array top oxide 38, the bitline contact 34 being bordered by the insulating sidewall spacer 30 of the wordline 24.

As also shown in FIG. 1A, in the supports portion 12, a transistor 40 is shown, having a gate conductor 42, and insulating sidewall spacers 44 and contacts-to-silicon (CS) 46 on each side. As in the DRAM array 10, contacts-to-silicon 46 are made bordered to the insulating sidewall spacers 44, on sidewalls of the gate conductor 42.

Figure 1B:
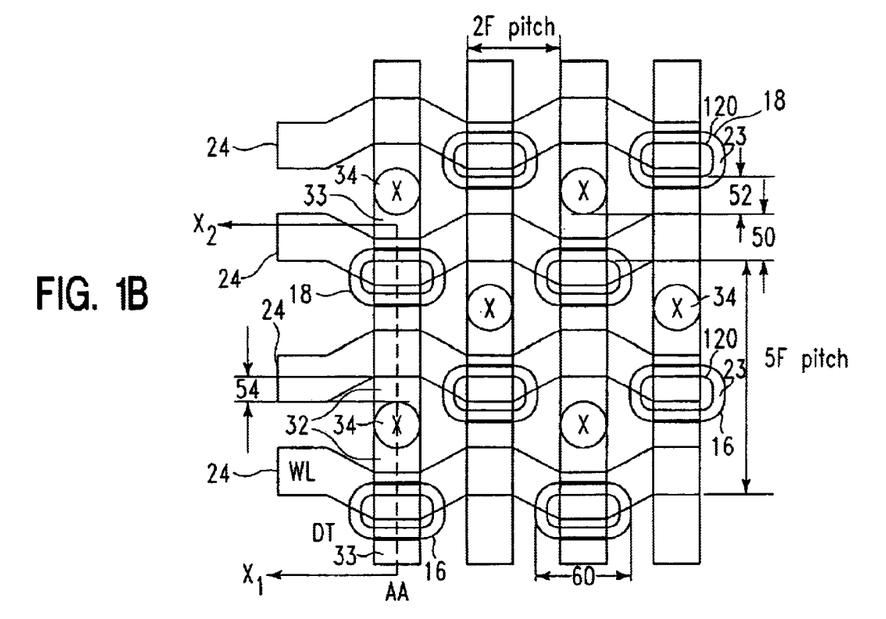
FIGS. 1B and 1C are plan views of alternative stuctural embodiments of the invention.

FIG. 1B shows a plan view of the DRAM array portion 10 in a preferred embodiment. As shown in FIG. 1B, wordlines 24 are preferably wiggled in a direction away from the bitline contact 34 where the wordline 24 crosses the active area 32. As illustrated in FIG. 1B, a gate conductor of deep trench 16 or 18 extends only to lines 120 where it meets active areas 32, 33 due to the annulus defined by insulating spacers 23 which are located within deep trenches 16, 18. In FIG. 1B, a deep trench size of 1F (equal to the minimum groundrule) is provided in the direction of the length of the active areas 32. As shown, the deep trenches 16, 18 preferably extend farther in the direction transverse to the active areas 32, 33.

In the embodiment shown in FIG. 1B, pitch of greater than 4F, for example, 5F pitch (five times the minimum lithographic feature size groundrule) is provided between deep trenches 16, 18 in the direction of the active area 32. With such pitch, and the wordlines 24 having centerlines which are offset from centerlines of the gate conductors (within deep trenches 16, 18), a desirable spacing 50 between the gate electrode 120 within deep trench 16 or 18 and bitline contact 34 can be attained. In addition, a desirable spacing 52 can be attained between the gate electrode 120 and a wordline 24. Finally, a desirable spacing 54 can be attained between the wordline 24 and the bitline contact 34. The desired spacing 50, 52, and 54 are selected to provide electrical isolation between component parts of the cell array over normal manufacturing tolerances for lithographically-defined critical dimensions and overlay tolerances as is known to those skilled in the art. Such desired spacing 50, 52, and 54 may be greater than F/5 and less than 1F.

Figure 1C:
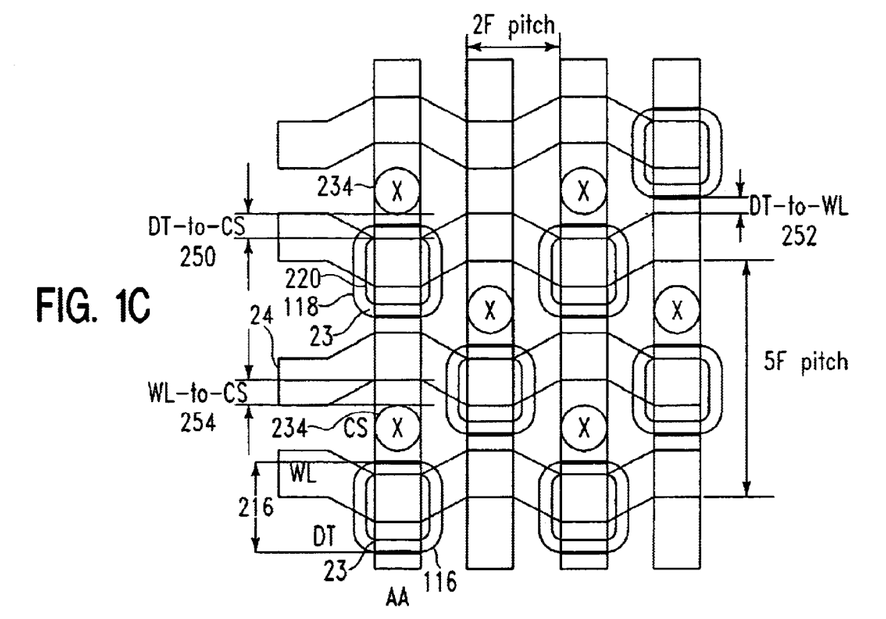

FIG. 1C illustrates a variation of the embodiment shown in FIG. 1B, with the main difference being increased size of deep trenches 116, 118 in FIG. 1C. It may be desirable to increase the deep trench size relative to the pattern size in order to increase storage node capacitance, array transistor on current, or both. Such increased: deep trench size is possible in the embodiment by virtue of the 5F wordline pitch, the use of insulating spacers 23 inside deep trenches 16, 18 and the wiggled wordlines 24. As shown, the deep trenches 16, 18 have greater extent 216 than 1F (minimum groundrule) in a direction of the length of active area 32. Despite the increased deep trench size 216, in this embodiment, certain spacings can still be attained between conductors in the array portion 10. That is, a non-zero deep trench to bitline contact spacing 250 is attained, as well as nonzero deep trench to wordline spacing 252, and non-zero wordline to bitline contact spacing 254 are attained.

Figure 2:
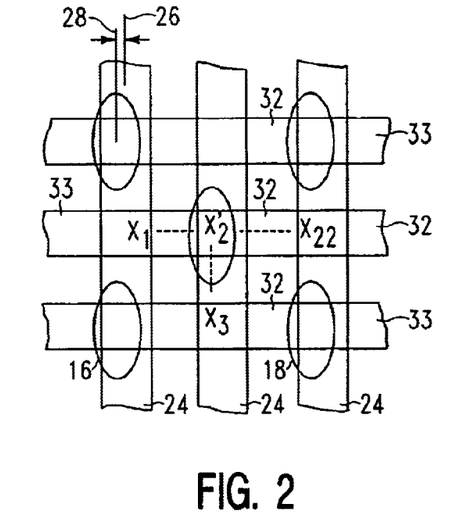
FIG. 2 is a plan view of another alternative structural embodiment of the invention.

FIG. 2 is a plan view showing the layout of another embodiment of the invention, in which, like the embodiments shown in FIGS. 1B and 1C, wordlines 24 have centerlines 26 which are offset from the centerlines 28 of the gate conductors. However, in this embodiment, the wordlines 24 are not wiggled. In order to make bordered contacts to bitline, and to allow for overlay tolerances, the wordline pitch can be relaxed, with a 5.5F pitch providing for minimum 2F spacing from edge of one wordline 24 to the edge of another wordline 24, assuming that wordlines are fabricated with width 0.75F by the process described above of printing resist patterns at 1F and further enlarging the openings before etching the wordlines 24.

Figure 3:
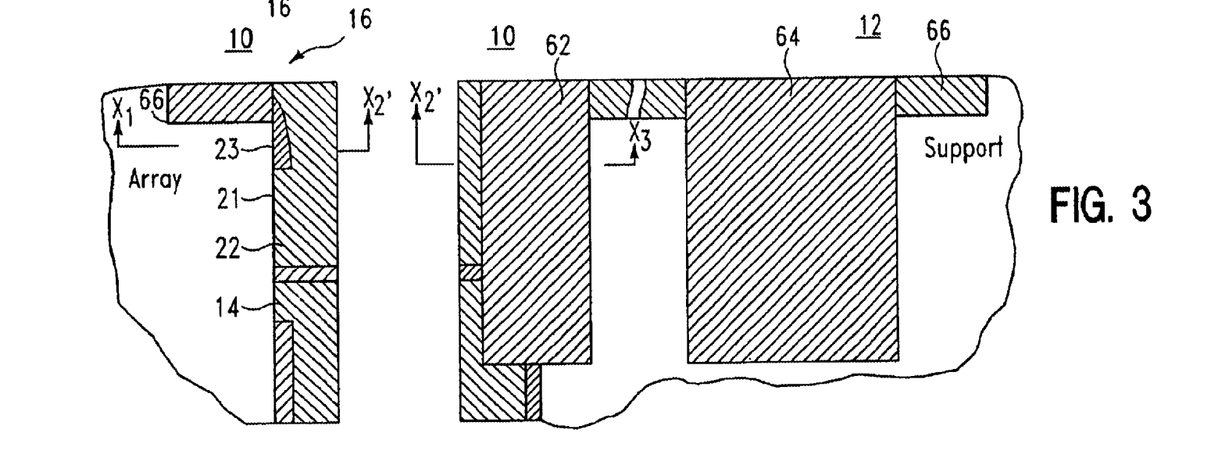
FIGS. 3 through 12 illustrate stages in the fabrication of an embodiment of the invention.
Figure 4:
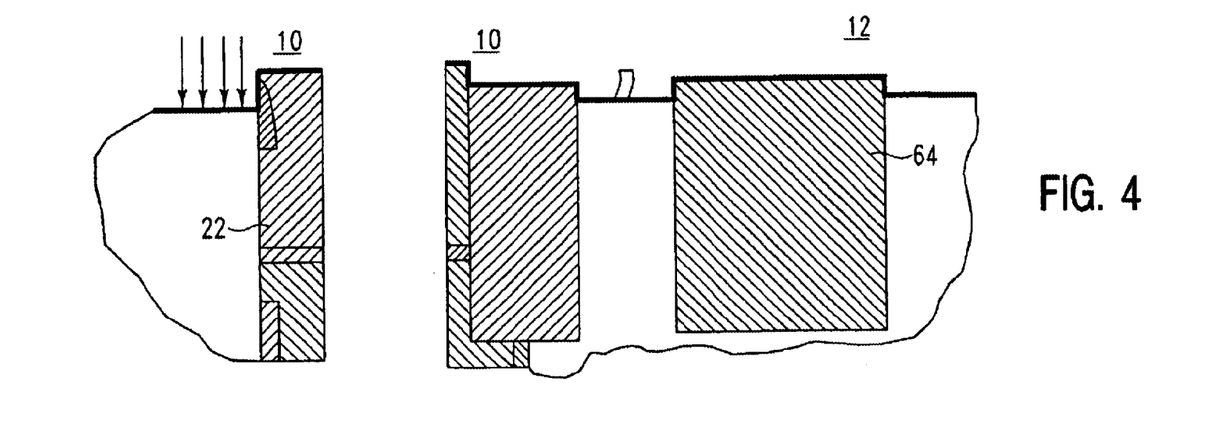

With reference to FIGS. 3 through 12, a process will now be described for fabricating a combined integrated circuit having both an array portion 10 and a logic portion 12, wherein the same process is used to fabricate wordlines 24 of the array portion and the logic portion 12 together. In each of FIGS. 3 through 9, views are shown along lines x1–x2', and x2'–x3. FIG. 3 illustrates a stage in the process from the starting point of the storage capacitor 14 and transistor having a channel 21, and a gate conductor 22 already formed. In addition, an insulating spacer 23 is also shown within deep trench 16, as well an isolation trench 62 which isolates the transistor of one deep trench from that of another, the isolation trench 62 extending in the x2–x3 direction between adjacent active areas 32. In addition, an array/logic isolation 64 is formed between the array portion 10 and the logic portion 12 in order to prevent unwanted interaction between the two. The isolation trench 62 and the array/logic isolation 64 are planarized to the top of an earlier deposited pad nitride layer 66. As illustrated in FIG. 4, the pad nitride layer 66 is deglazed and removed, and implants are made to single crystal semiconductor regions in the DRAM array portion 10. Logic portion 12 would typically be block masked during such implants.

Figure 5:
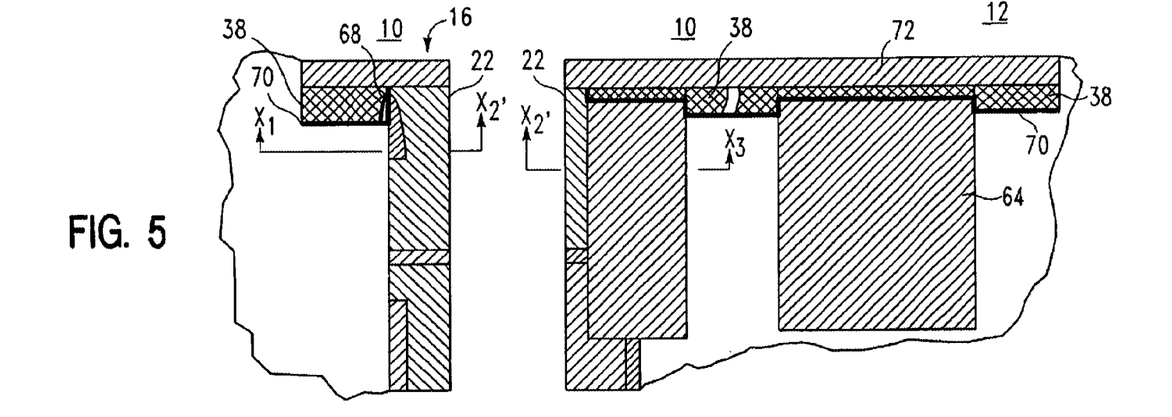
Figure 6:
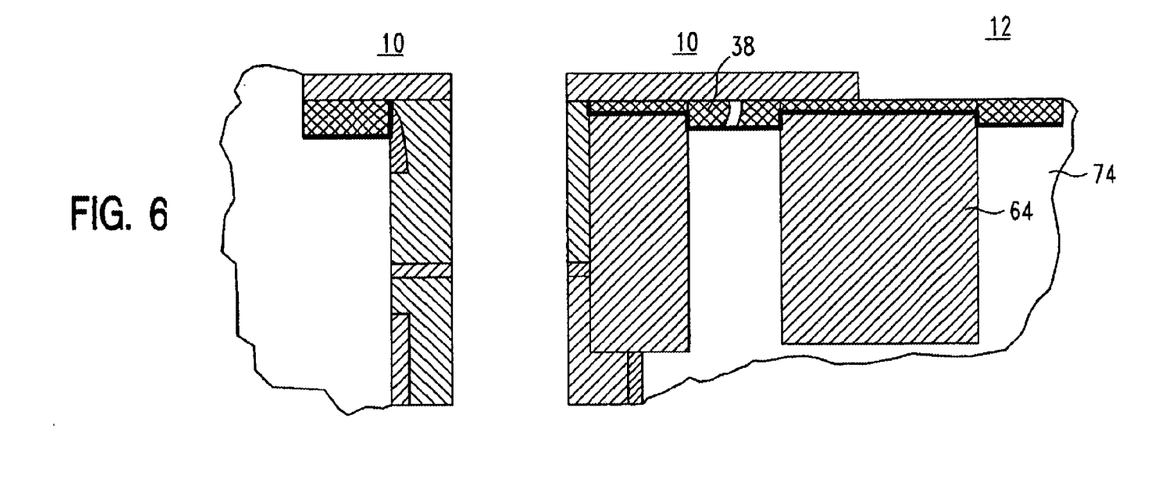

Then, as illustrated in FIG. 5, an optional nitride spacer 68 may be formed adjacent to the deep trench 16, abutting the optional sidewall spacer 23 within deep trench 16, if any. A liner 70, preferably of silicon nitride, is then deposited. Next, the array top oxide 38 is deposited, preferably by high density plasma method, and preferably to a depth of 85 nm. The array top oxide is then made planar to the surface of the liner 70 over the trench gate conductor 22, and the liner 70 is selectively removed from over the trench gate conductor 22. A polysilicon layer 72 is then deposited which will make electrical contact to the surface of the trench gate conductor 22 and later serve as the wordline interconnect in the array region 10. A block lithographic mask is then used to remove the polysilicon 72 from the support regions 12 as shown in FIG. 6.

Figure 7:
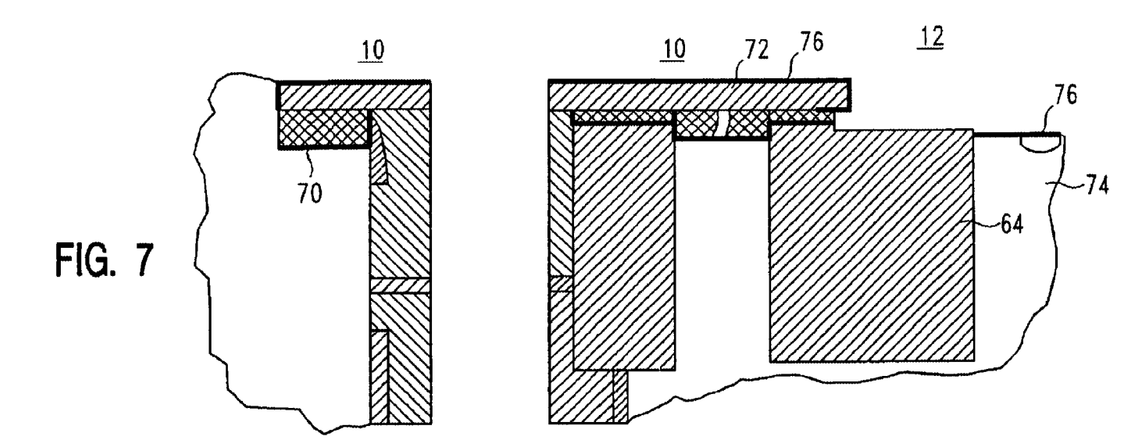

Then, as illustrated in FIG. 7, the array top oxide 38 is selectively removed from the support regions 10 to expose the silicon substrate 74 and logic STI regions 64. A sacrificial oxide 76 is formed by thermal oxidation over the support regions 10 and over the array polysilicon 72. The logic CMOS wells and threshold adjustment ion implantation are then performed in the usual manner for CMOS integrated circuits. Thereafter, the sacrificial oxide is stripped and a CMOS gate dielectric 76, such as thermally formed silicon dioxide, or high-k materials such as Hf-containing and or Zr-containing oxide is formed on a top surface of the substrate 74.

Figure 8A:
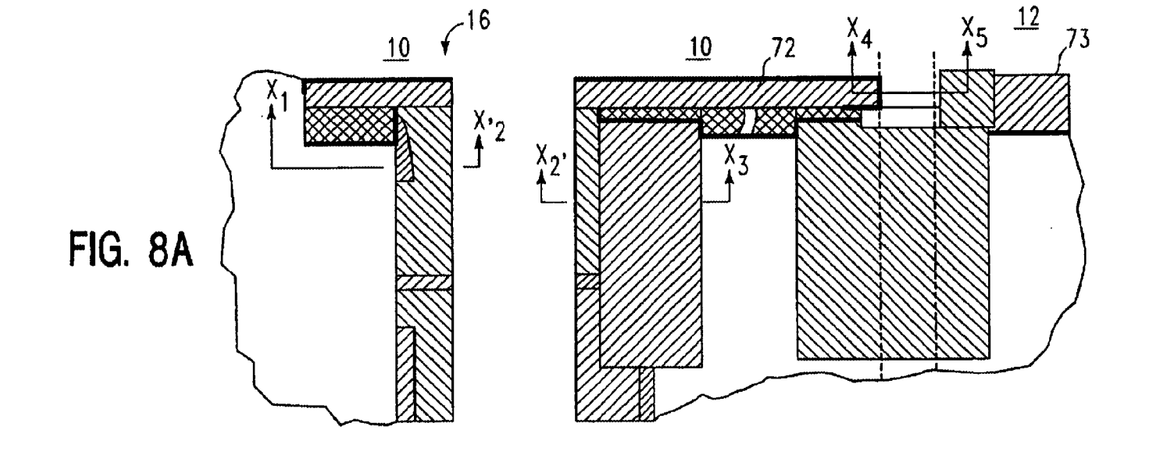
Figure 8B:
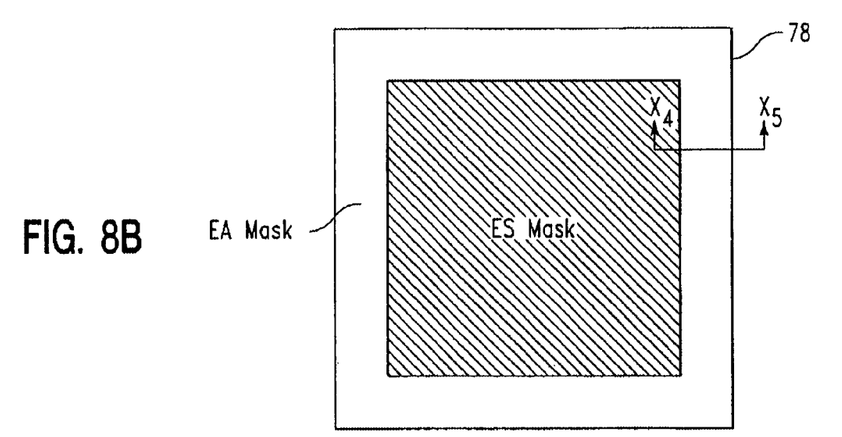
Figure 9:
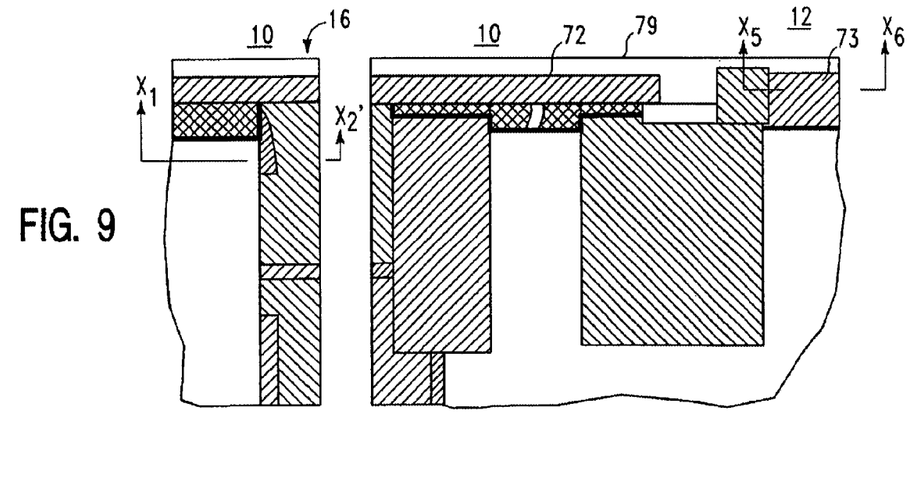

Next, with reference to FIG. 8A, CMOS gate electrode polysilicon 73 is deposited in the logic portion 12 to a depth, e.g. 150 nm, such that the top surfaces of array polysilicon 72 and support gate polysilicon 73 will be coplanar for subsequent lithographic patterning. A mask 78, shown in plan view in FIG. 8B is then used to pattern the removal of polysilicon 72, 73 so as to isolate the array portion 10 from the logic portion 12. Then, as illustrated in FIG. 9, oxide 76 is stripped from the polysilicon 72, followed by the deposition and patterning of a TEOS oxide layer thereabove, for use as a hardmask in defining the gate conductors of the logic portion 12 and the wordlines of the array portion 10.

Figure 10:
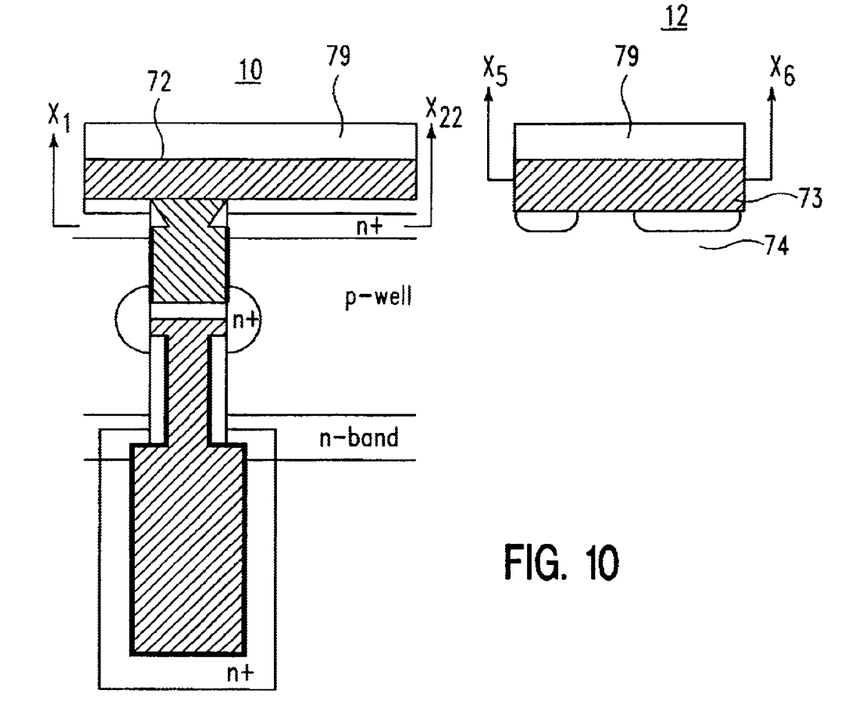
Figure 11:
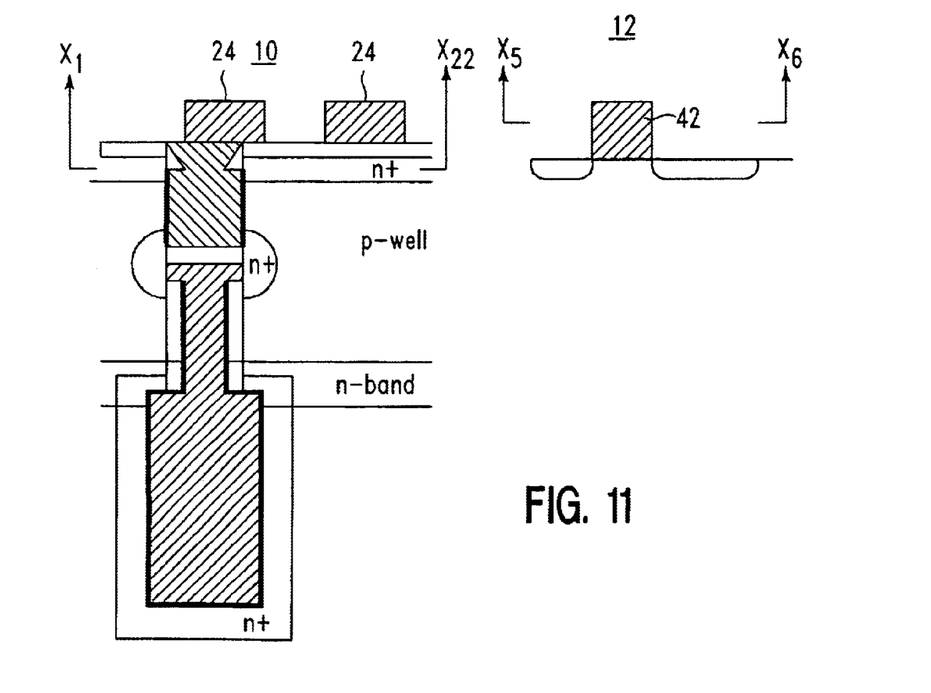
Figure 12:
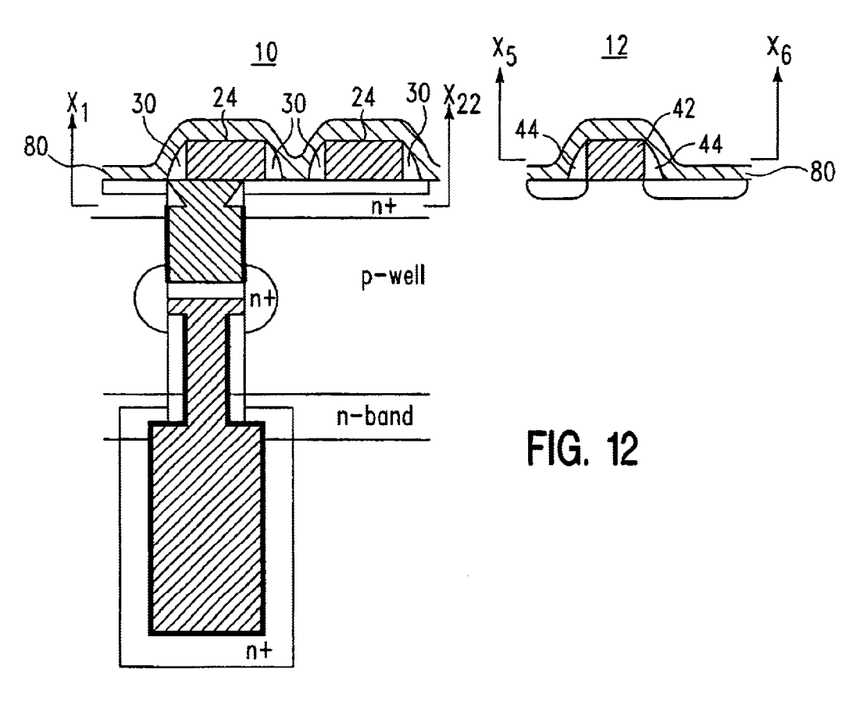

FIG. 10 illustrates a view through lines x1–X22, and X5–X6 of the embodiment at this stage of fabrication. As shown in FIG. 11, wordlines 24 are then patterned and etched in the array portion 10 at the same time, and preferably by the same process that the gate conductor 42 is etched in the logic portion 12 of the integrated circuit. The fabrication of the CMOS logic transistors in the support regions 12 proceeds in the standard manner as is known to those skilled in the art including ion implantation of the source and drain regions before and or after the formation of sidewall spacers, and thermal activation of impurity dopants by rapid thermal annealing. As an illustrative embodiment of the fabrication of CMOS transistors, as illustrated in FIG. 12, insulating sidewall spacers 30 are then formed, by known methods, on sidewalls of the wordlines 24 and as spacers 44 on sidewalls of gate conductor 42. A metal 80, capable of reacting with silicon to form a conductive silicide, is then deposited to cover wordlines 24 and gate conductor 42.

Then, referring to FIG. 1A again, the wafer is heated to react the metal 80 with the underlying polysilicon of the wordline 24 and gate conductor 42 to form a suicide 27. Thereafter, an interlevel dielectric 82 is deposited, and openings are etched therein, stopping on the underlying single crystal silicon 32. Contact 34 in the array portion 10 and contacts 46 in the logic portion 12 are then formed by depositing polysilicon and/or a silicide to fill the openings.

While the invention has been described herein in accordance with certain preferred embodiments thereof, those skilled in the art will recognize the many modifications and enhancements which can be made without departing from the true scope and spirit of the present invention, limited only by the claims appended below.

What is claimed is:

1. An integrated circuit including a dynamic random access memory (DRAM) array, said DRAM array comprising:
   at least one first DRAM cell comprising:
   a storage capacitor formed within a deep trench etched into a substrate;
   a first transistor having a channel of length extending along a sidewall of said deep trench and further having a gate conductor overlying said storage capacitor within said deep trench;
   first active area extending from said channel of said first transistor;
   a wordline physically contacting said gate conductor from above, a centerline of said wordline being offset from a centerline of said gate conductor, said wordline having at least a top layer of a material selected from the group consisting of a metal and a metal silicide, said wordline further including an insulating sidewall spacer;
   an interlevel dielectric deposited onto said top layer of said wordline; and
   a bitline contact to said active area disposed in an opening etched in said interlevel dielectric, said bitline contact bordered by said insulating sidewall spacer of said wordline.

2. The integrated circuit of claim 1 wherein said bitline contact is further bordered on a side opposite said insulating sidewall spacer.

3. The integrated circuit of claim 2 wherein said wordline is wiggled in a direction away from said bitline contact where said wordline crosses said first active area.

4. The integrated circuit of claim 1 wherein said DRAM array includes a pair of DRAM cells including said first DRAM cell and a second DRAM cell accessed by said active area and said bitline contact.

5. The integrated circuit of claim 4 further comprising array top oxide overlying said active area, said bitline contact further being disposed in an opening in said array top oxide.

6. The integrated circuit of claim 5 wherein said bitline contact is further bordered by a spacer formed on a sidewall of a passing conductor formed over said array top oxide on a side opposite said first DRAM cell.

7. The integrated circuit of claim 5 wherein said passing conductor includes a metal suicide extending to said array top oxide.

8. The integrated circuit of claim 7 wherein said silicide is formed by a self-aligned (salicide) process.

9. The integrated circuit of claim 1 further comprising an insulating spacer situated within said deep trench above said vertical transistor.

10. The integrated circuit of claim 1 further comprising a second transistor having a channel of length extending along a sidewall of said deep trench and second active area extending from said second transistor in a different direction from that of said first active area.

11. The integrated circuit of claim 1 wherein said bitline contact comprises a metal silicide.

12. The integrated circuit of claim 11 wherein said silicide is formed by a self-aligned (salicide) process.

13. The integrated circuit of claim 1 wherein said wordline includes a silicide extending to said gate conductor.

14. The integrated circuit of claim 13 wherein said silicide is formed by a self-aligned (salicide) process.

15. The integrated circuit of claim 1 further including a logic portion, said logic portion including a contact to silicon comprising a metal silicide extending to a single crystal semiconductor region of a substrate.

16. The integrated circuit of claim 1 wherein a width of said deep trench measures greater than the minimum groundrule F in a direction of the length of said first active area.

* * * * *